(12) United States Patent
Kajiwara et al.

(10) Patent No.: US 8,254,163 B2
(45) Date of Patent: Aug. 28, 2012

(54) SPINTRONIC DEVICE AND INFORMATION TRANSMITTING METHOD

(75) Inventors: Yosuke Kajiwara, Miyagi (JP); Kenichi Uchida, Miyagi (JP); Kazuya Ando, Miyagi (JP); Eiji Saitoh, Kanagawa (JP)

(73) Assignee: Keio University, Tokyo (JP)

( * ) Notice: Subject to any disclaimer, the term of this patent is extended or adjusted under 35 U.S.C. 154(b) by 105 days.

(21) Appl. No.: 12/996,509

(22) PCT Filed: Jun. 4, 2009

(86) PCT No.: PCT/JP2009/060225
§ 371 (c)(1),
(2), (4) Date: Dec. 6, 2010

(87) PCT Pub. No.: WO2009/148108
PCT Pub. Date: Dec. 10, 2009

(65) Prior Publication Data
US 2011/0075476 A1 Mar. 31, 2011

(30) Foreign Application Priority Data
Jun. 5, 2008 (JP) .................. 2008-148556

(51) Int. Cl.
*G11C 11/18* (2006.01)
(52) U.S. Cl. ............ 365/170; 257/421; 257/E29.323
(58) Field of Classification Search ............ 365/170; 257/421, E29.323
See application file for complete search history.

(56) References Cited

U.S. PATENT DOCUMENTS

| 7,710,768 B2* | 5/2010 | Naito ............... 365/164 |
| 2007/0253121 A1 | 11/2007 | Yamada et al. |
| 2009/0052237 A1* | 2/2009 | Morise et al. .......... 365/171 |

FOREIGN PATENT DOCUMENTS

| JP | 2002-305337 A | 10/2002 |
| JP | 2004-102330 A | 4/2004 |
| JP | 2005-019561 A | 1/2005 |
| JP | 2007-059879 A | 3/2007 |
| JP | 2007-294710 A | 11/2007 |

OTHER PUBLICATIONS

Harii, K. et al. "Inverse spin-Hall effect and spin pumping in metallic films (invited)," Journal of Applied Physics, published online Feb. 7, 2008, vol. 103, pp. 07F311-1-07F311-4.
Kimura, T. et al. "Room-Temperature Reversible Spin Hall Effect," Physical Review Letters, published Apr. 12, 2007, vol. 98, No. 15, pp. 156601-1-156601-4.

(Continued)

*Primary Examiner* — VanThu Nguyen
(74) *Attorney, Agent, or Firm* — Westerman, Hattori, Daniels & Adrian, LLP

(57) ABSTRACT

A concrete means for making transmission over long distances possible using a spin-wave spin current is provided in a spintronic device and an information transmitting method. At least one metal electrode made of any of Pt, Au, Pd, Ag, Bi, alloys of these, or elements having an f-orbital are provided on top of a magnetic dielectric layer and, so that spin-wave spin current—pure spin current exchange is carried out at the interface between the above described magnetic dielectric layer and the above described metal electrode.

6 Claims, 14 Drawing Sheets

OTHER PUBLICATIONS

Takanashi, Koki "Creation and Control of Spin Current in Solids," Institute for Materials Research, Tohoku University, Applied Physics, vol. 77, No. 3, 2008, p. 255.

Saitoh, E. et al. "Conversion of spin current into charge current at room temperature: Inverse spin-Hall effect," Applied Physics Letters, Accepted Mar. 15, 2006, vol. 88, pp. 182509-1-182509-3.

Murakami, Shuichi et al. "Dissipationless Quantum Spin Current at Room Temperature," Science, Accepted for publication Jul. 25, 2003, vol. 301, pp. 1348-1351.

International Search Report of PCT/JP2009/060225, mailing date Aug. 25, 2009.

* cited by examiner (a)

(b)

(c)

(d)

(e)

(a)

(b)

(a)

(b)

(c)

(a)

(b)

(c)

(a)

(b)

(a)

(b)

SPINTRONIC DEVICE AND INFORMATION TRANSMITTING METHOD

TECHNICAL FIELD

The present invention relates to a spintronic device and information transmitting method, and in particular to a spintronic device having a magnetic dielectric layer for transmitting a spin flow as a spin-wave spin current so that it can be transmitted over a distance of millimeters.

BACKGROUND ART

Currently in the field of electronics, for example with semiconductor devices, charge degree of freedom of electrons are used; electrons have spin degrees of freedom, in addition to charge degree of freedom. In recent years, spintronics using spin degree of freedom have been drawing attention as a next-generation carrier for information technology.

In spintronics, the charge degree of freedom and the spin degree of freedom of electrons are simultaneously used in order to gain new functions and properties.

Spin RAMs that control the direction of magnetization of a free layer using the spin of electrons which are carriers of a current by making a current flow directly through a GMR element or a TMR element are one example of an application of spintronics (see for example Patent Document 1 and Patent Document 2).

In addition, quantum computers can be cited as another application of spintronics. In quantum computers, the spin of atoms, ions and molecules is used as quantum bits (Qubits) (see for example Patent Document 3).

Thus, it is clear that quantum calculation and quantum information storage are possible using the dynamics of spin in magnetic recording, and it is known that use of a spin current is useful for readout and control.

Currently information transmission in information processing apparatuses is carried out using electron flow, which causes Joule heat. Joule heat is a problem, in that the more the information processing unit is integrated, the higher the power consumption is, and therefore information transmission using spin current instead of electron flow has been investigated. Such information transmission is based on the use of spin current, which is a reversible process, instead of the flow of conduction electrons in a solid, which is chronologically irreversible. Since barely any spin angular momentum is dissipated, the power consumption does not increase.

Spin-Hall effect is well known in spintronics. When an electric current flows through a sample, a pure spin current is generated in a direction perpendicular to the direction of the electric current, and there is no flow of charge, and the spin polarization is accumulated at the sample edge in the direction of the pure spin current (see for example Non-Patent Document 1).

The inventors found out that when a pure spin current is injected into a sample, an electric current flows in a direction perpendicular to the direction of the pure spin current. Inverse spin-Hall effects cause a difference in potential at the end of a sample, and therefore it is possible to detect whether or not there is a pure spin current by detecting this difference in potential (see for example Non-Patent Document 2).

PRIOR ART DOCUMENTS

Patent Documents

Patent Document 1: Japanese Unexamined Patent Publication 2002-305337

Patent Document 2: Japanese Unexamined Patent Publication 2007-059879

Patent Document 3: Japanese Unexamined Patent Publication 2004-102330

Non-Patent Documents

Non-Patent Document 1: Science, Vol. 301, p. 1348, 2003
Non-Patent Document 2: Applied Physics Letters, Vol. 88, p. 182509, 2006
Non-Patent Document 3: Applied Physics, Vol. 77, No. 3, p. 255, 2008

SUMMARY OF THE INVENTION

Problem to be Solved by the Invention

In spintronic devices using a conductor, a spin current is transferred by conduction electrons where there is spin relaxation, which means damping of the precession of the spins or the magnetic moment, as the spin current is transferred. Since the spin relaxation time is a material parameter and thus limited, there is a problem such that the distance over which a pure spin current can be transferred is limited to several tens to several hundreds of nanometers.

Therefore, even in the case where a pure spin current is used as an information transmitting means or a current transfer means so as not to increase power consumption due to very little dissipation in the spin angular momentum, there is a problem with the short distance of transmission.

Meanwhile, it is predicted that use of spin-wave spin current will make it possible to lower the loss of spin current and transmit spin current over long distances (see for example Non-Patent Document 3). As schematically shown in FIG. 14, spin-wave spin current is spin in precession around the point of equilibrium, and the change in phase propagates through the spin system as a wave.

This transmission using spin-wave spin current makes transmission over long distances possible due to little dissipation of spin angular momentum. Though the possible use of spin-wave spin current is predicted, how exactly to implement this is as of yet unclear.

Accordingly, an object of the present invention is to provide a concrete means for making transmission over long distances possible using spin-wave spin current.

Means for Solving Problem

Here, the means for solving the problem is described.

In order to solve the above described problem, the present invention provides a spintronic device having; a magnetic dielectric layer; and at least one metal electrode made of an element having strong spin-orbit coupling, such as Pt, Au, Pd, Ag, Bi, alloys of these, or elements having an f-orbital, wherein spin-wave spin current—pure spin current exchange is carried out at the interface between the above described magnetic dielectric layer and the above described metal electrode.

After diligent research, the present inventors discovered that a magnetic dielectric material and a metal electrode made of an element having strong spin-orbit coupling, such as Pt, Au, Pd, Ag, Bi, alloys of these, or elements having an f-orbital, can be used as means for injecting and converting a spin-wave spin current, so spin-wave spin current—pure spin current exchange is possible at the interface between the magnetic dielectric layer and the metal electrode. In this case, spin-Hall effects are used to inject a spin-wave spin current, and inverse spin-Hall effects are used to convert a spin-wave spin current.

Accordingly, low-loss spin current transmission and transmission of an electric current via a magnetic dielectric material are possible using interface between the magnetic dielectric material and the metal electrode made of any of Pt, Au, Pd, Ag, Bi, alloys of these, or elements having an f-orbital.

In this case, if at least two metal electrodes are provided so that one metal electrode serves as a spin current injection electrode through which a spin-wave spin current is injected into the magnetic dielectric layer and another metal electrode serves as an output electrode for converting the spin-wave spin current from the magnetic dielectric layer as a electric current, information transmission and electric current transmission are possible.

In addition, the magnetic dielectric layer may be made of any of a ferrimagnetic dielectric material, a ferromagnetic dielectric material or an antiferromagnetic dielectric material, and if a ferrimagnetic dielectric material or a ferromagnetic dielectric material is used, it is desirable to have the antiferromagnetic dielectric layer for fixing the direction of magnetization of the magnetic dielectric layer. Typical examples of the antiferromagnetic dielectric layer are nickel oxide and FeO, and most magnetic dielectric materials are antiferromagnetic.

In addition, though the ferrimagnetic dielectric material or ferromagnetic dielectric material may be any dielectric material containing Fe or Co, it is desirable to use YIG (yttrium iron garnet) or yttrium gallium iron garnet, which are easily available and have barely any dissipation of spin angular momentum; that is to say, a material that can be represented by the general formula $Y_3Fe_{5-x}Ga_xO_{12}$ (x<5). This is because $Y_3Fe_{5-x}Ga_xO_{12}$ has a large band gap with very few conduction electrons, and thus has barely any dissipation of spin angular momentum, due to the conduction electrons.

In addition, the present invention provides an information transmitting method having the steps of; providing at least a pair of metal electrodes made of any of Pt, Au, Pd, Ag, Bi, alloys of these, or elements having an f-orbital on top of a magnetic dielectric layer; making a signal current flow through one of the above described pair of metal electrodes so that a spin-wave spin current corresponding to the signal current is injected into the above described magnetic dielectric layer; making the spin-wave spin current transmitted through the above described magnetic dielectric layer generate a pure spin current in the other of the above described pair of metal electrodes; and converting to a signal current in a direction perpendicular to the above described pure spin current.

Effects of the Invention

The proposed spintronic device makes low-loss spin current transmission and transmission of an electric current via a magnetic dielectric material possible.

BEST MODE FOR CARRYING OUT THE INVENTION

Next, the embodiments of the present invention are described in reference to FIGS. 1 to 11. According to the present invention, spin current is transferred through a magnetic dielectric material with very low loss as spin-wave spin current, and spin-wave spin current—pure spin current exchange is carried out at the interface between the magnetic dielectric material and the metal electrode made of any material having strong spin-orbit coupling between the spin and the orbital, such as Pt, Au, Pd, Ag, Bi, alloys of these, or elements having an f-orbital.

In this spin-wave spin current—pure spin current exchange, the spin current generated by an electric current in the metal electrode and the spin in the magnetic dielectric material are exchanged so as to provide a spin-wave spin current that propagates through the magnetic dielectric material. Meanwhile, the spin-wave spin current in the magnetic dielectric material is exchanged with the spin in the metal electrode so that a spin current is generated in the metal electrode, and thus an electric current is generated.

In addition, the magnetic dielectric layer may be made of any of a ferrimagnetic dielectric material, a ferromagnetic dielectric material, or an antiferromagnetic dielectric material. The magnetic dielectric material may be any dielectric material containing Fe or Co, and YIG (yttrium iron garnet) or yttrium gallium iron garnet, which are easily available and have barely any dissipation of spin angular momentum; that is to say, a material that can be represented by the general formula $Y_3Fe_{5-x}Ga_xO_{12}$ (x<5), are generally used.

Figure 1:
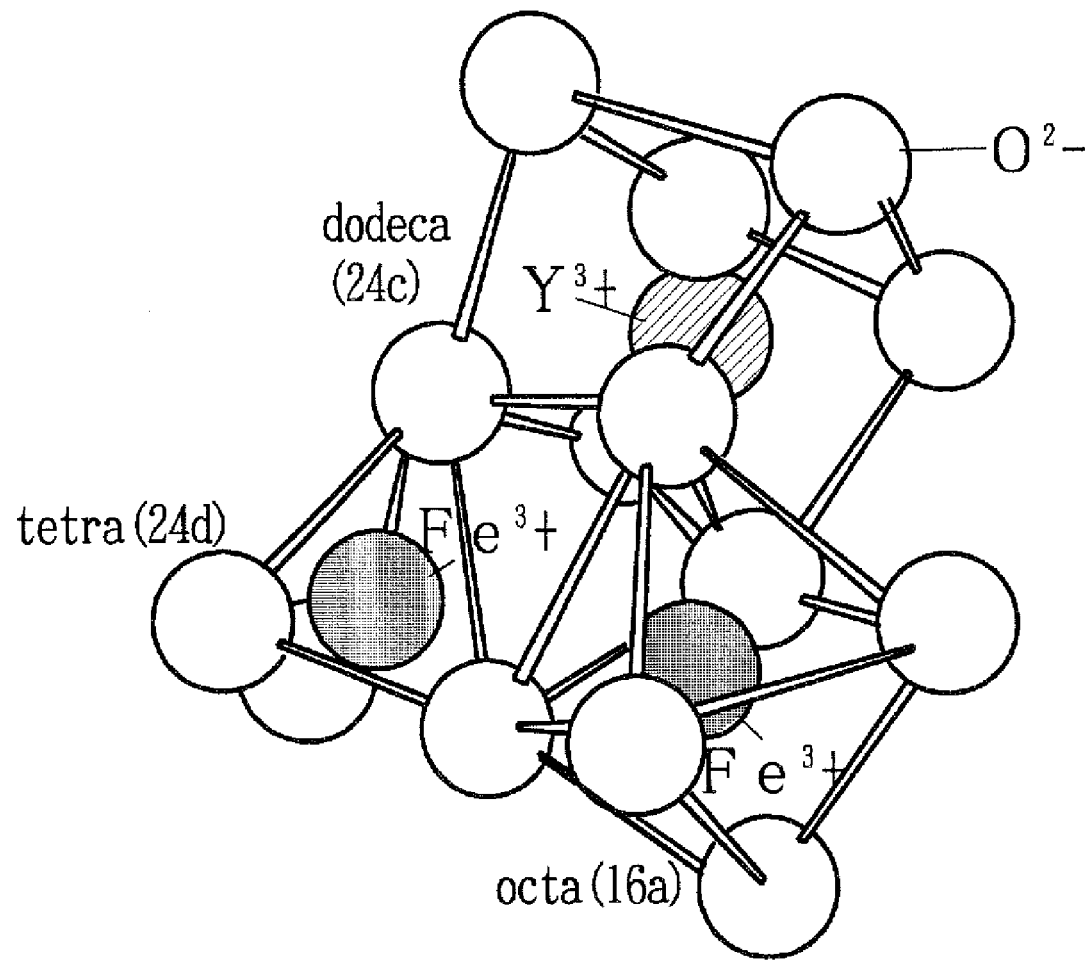
FIG. 1 is a diagram showing the crystal structure of YIG ($Y_3Fe_5O_{12}$)
Figure 2:
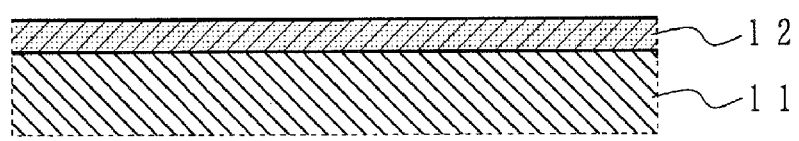
FIGS. 2(a) to 2(e) are diagrams illustrating the manufacturing process for a sample in one embodiment of the present invention.
Figure 2:
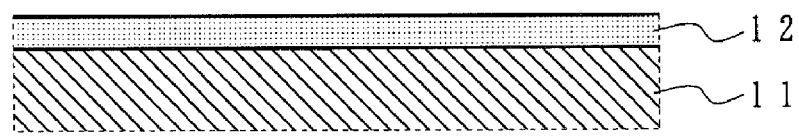
Figure 2:
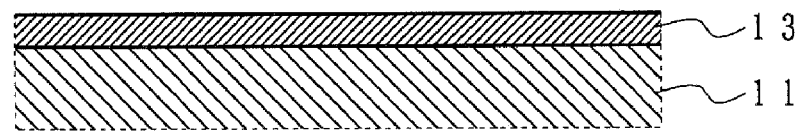
Figure 2:
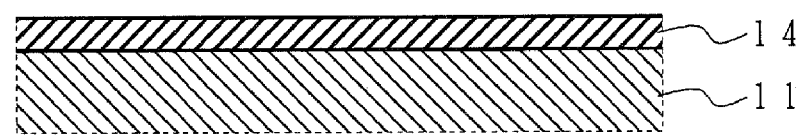
Figure 2:
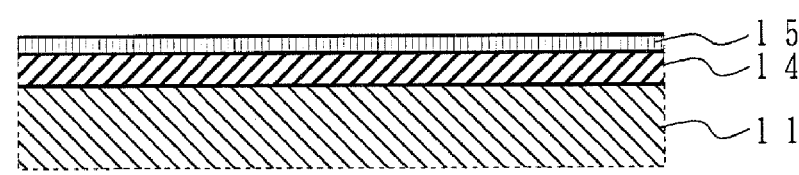
Figure 3:
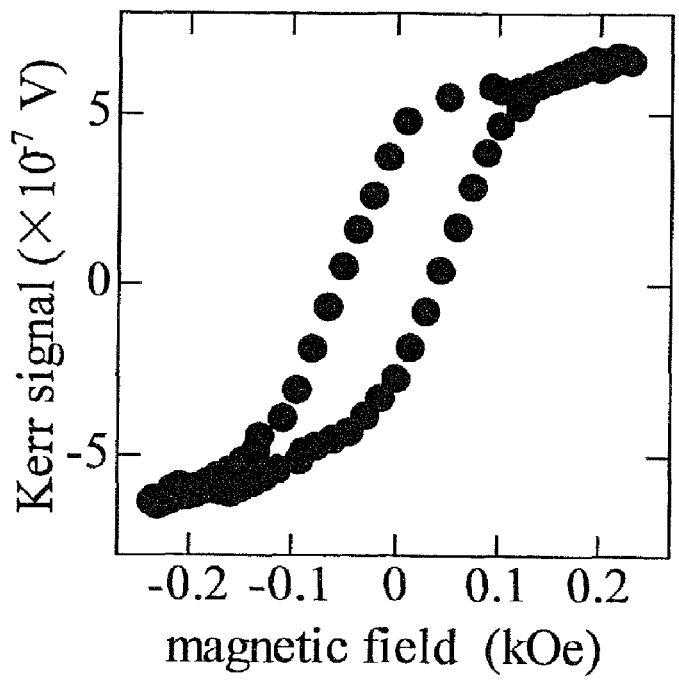
FIGS. 3(a) and 3(b) are graphs showing the characteristics of the YIG film.
Figure 3:
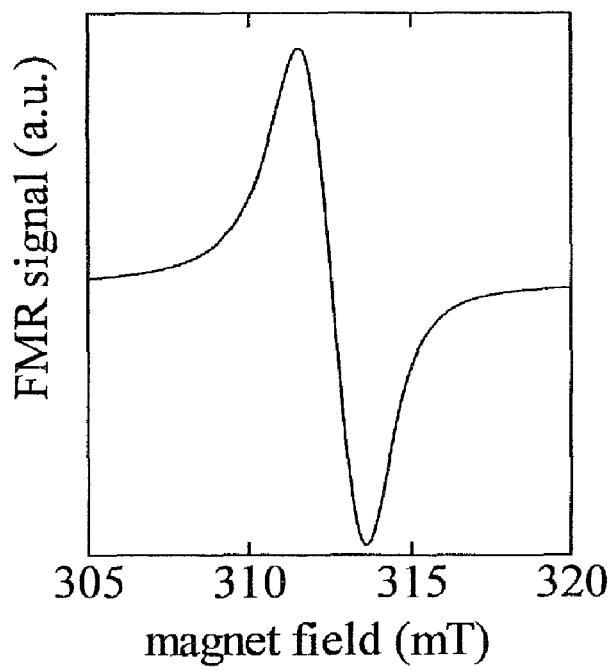
Figure 4:
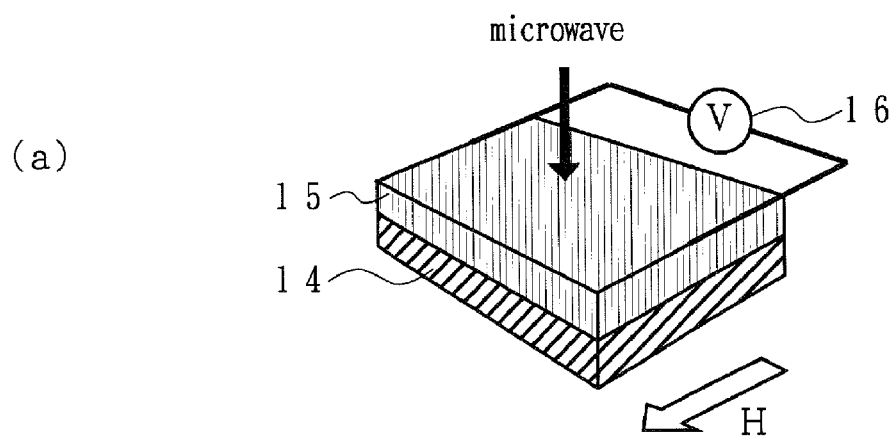
FIGS. 4(a) to 4(c) are a diagram and graphs showing the results of verification of the inverse spin-Hall effects in a YIG/Pt junction.
Figure 4:
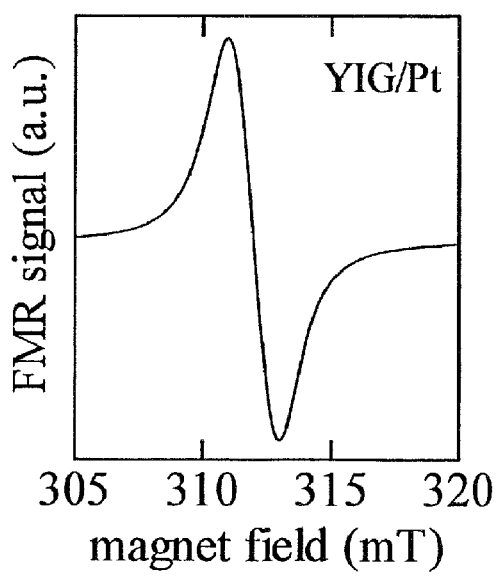
Figure 4:
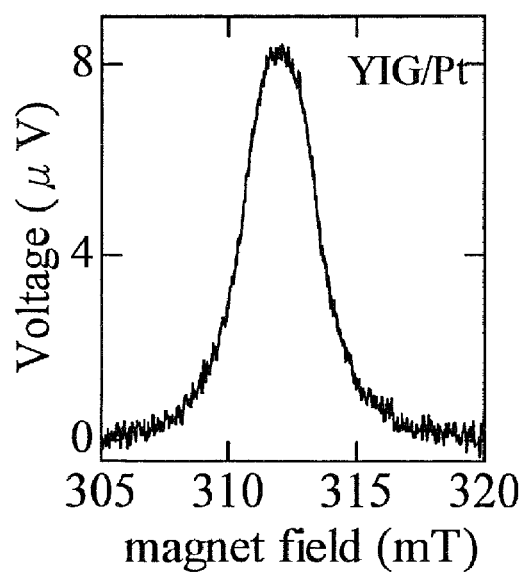
Figure 5:
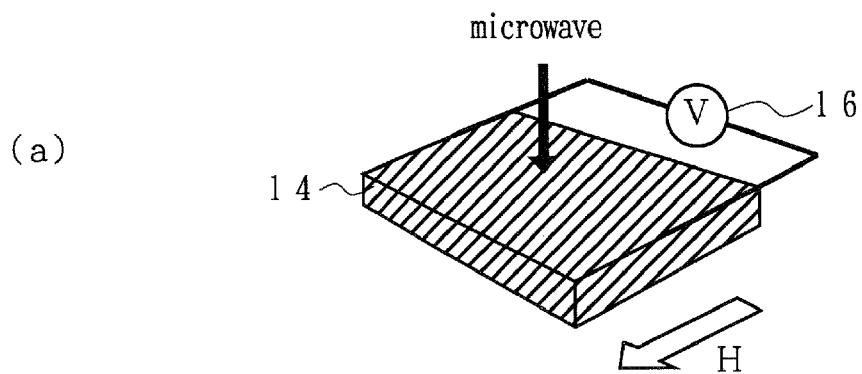
FIGS. 5(a) to 5(c) are a diagram and graphs showing the results of verification of the inverse spin-Hall effects in a reference sample using only a YIG film.
Figure 5:
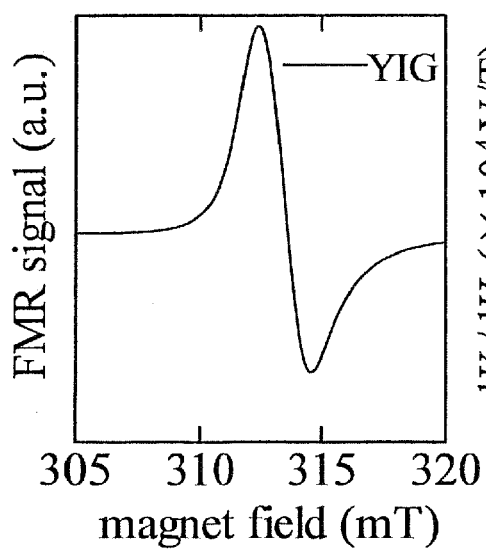
Figure 5:
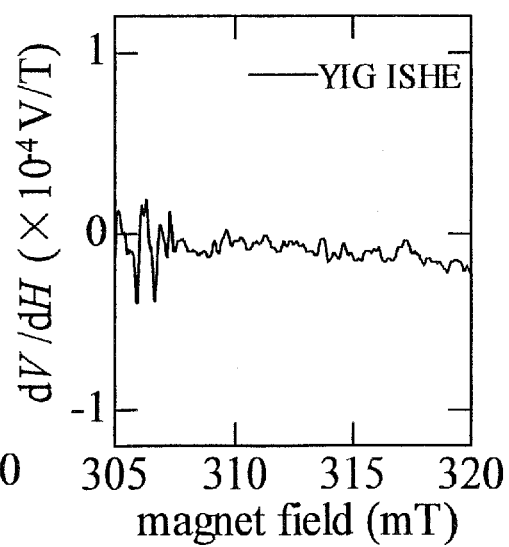
Figure 6:
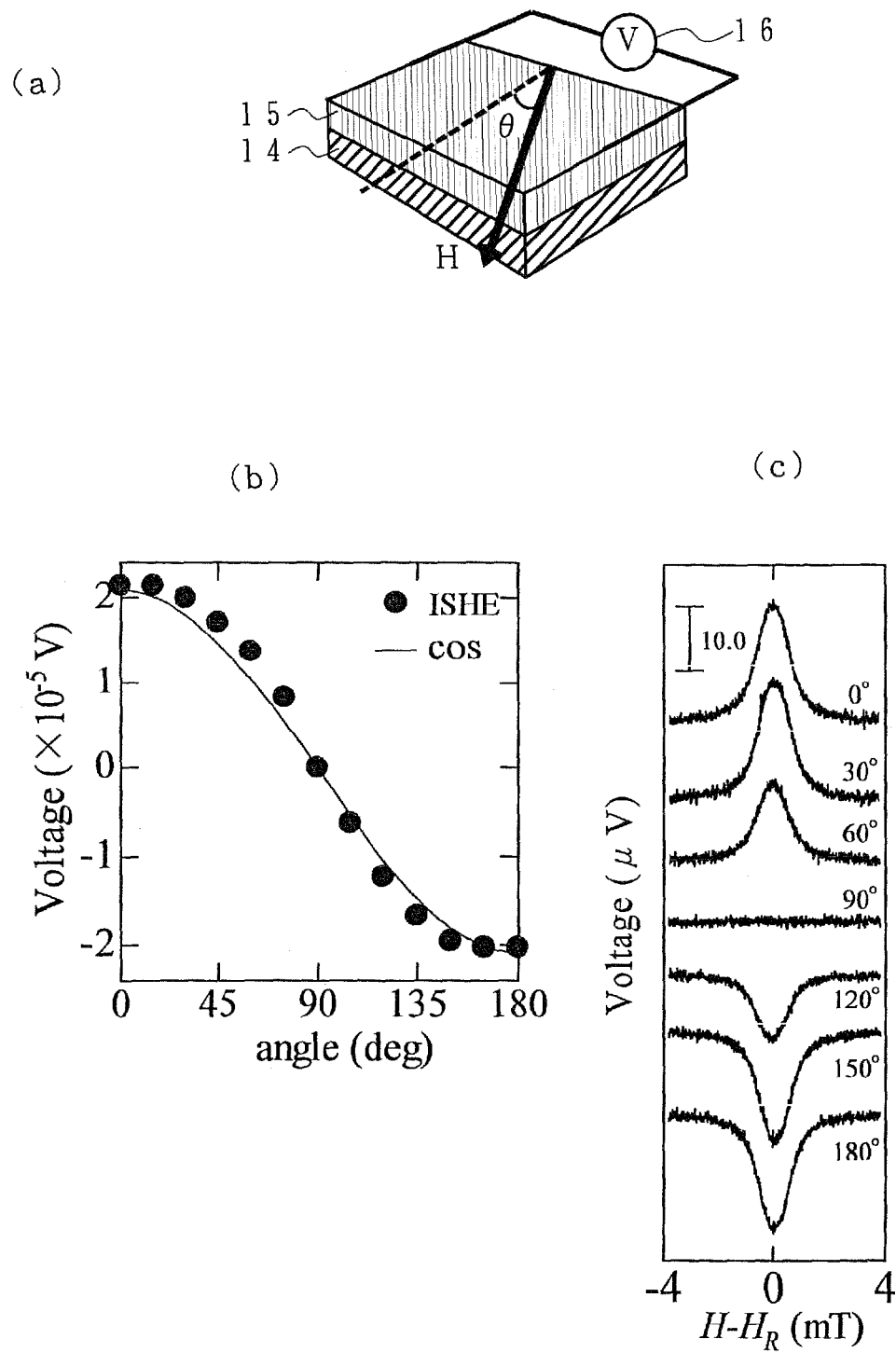
FIGS. 6(a) to 6(c) are a diagram and graphs showing the dependence of the inverse spin-Hall effects on the angle θ.
Figure 7:
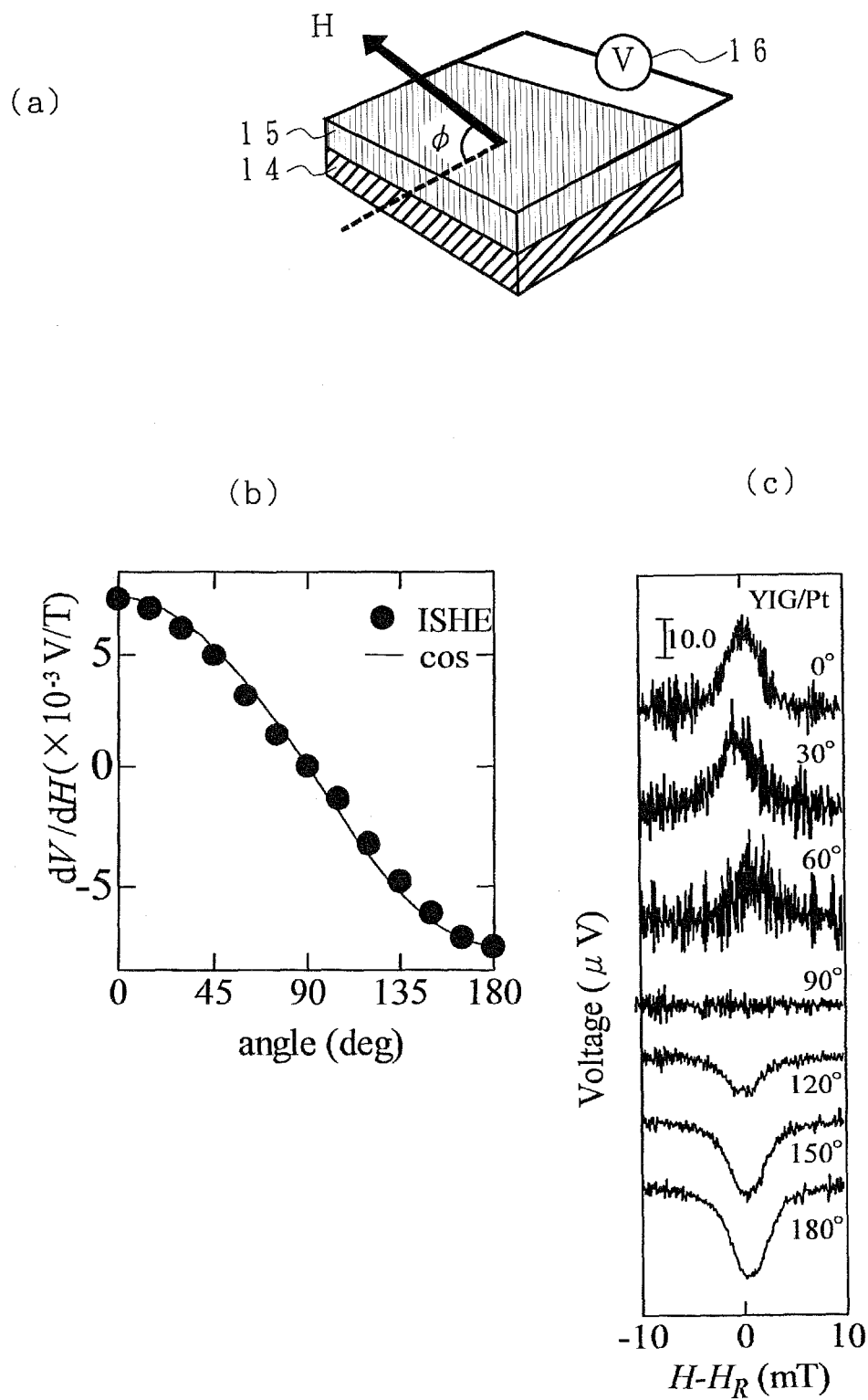
FIGS. 7(a) to 7(c) are a diagram and graphs showing the dependence of the inverse spin-Hall effects on the angle φ.
Figure 8:
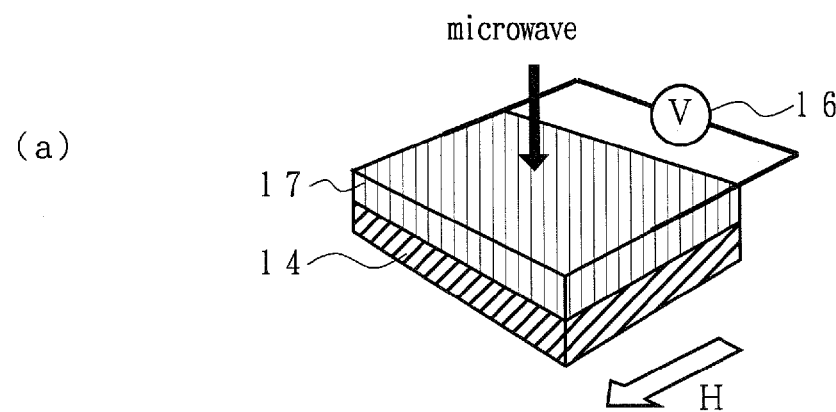
FIGS. 8(a) and 8(b) are a diagram and a graph showing the dependence of the inverse spin-Hall effects on different materials.
Figure 8:
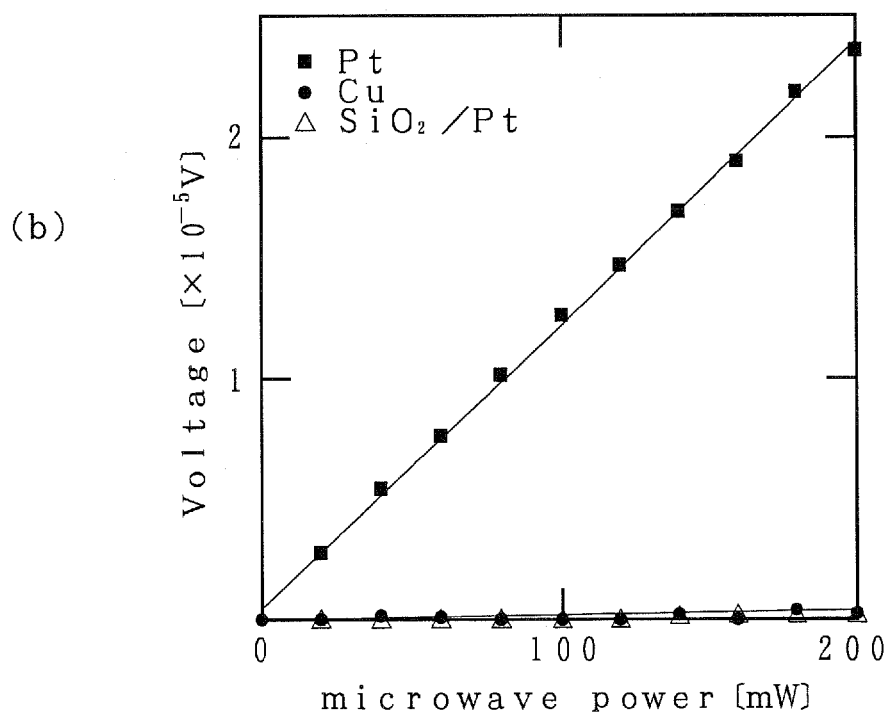

FIG. 1 is a diagram showing the crystal structure of YIG ($Y_3Fe_5O_{12}$), which is a cubic crystal with a ferrimagnetic structure. In addition, the only magnetic ions in YIG are $Fe^{3+}$, and there are twenty-four Fe↑ (up spins) and sixteen Fe↓ (down spins) per unit lattice. Accordingly, YIG has a magnetic moment for eight Fe ions as a unit lattice value. The other Fe ions are bonded in an antiferromagnetic manner.

In the case of $Y_3Fe_{5-x}Ga_xO_{12}$, the Fe atoms in $Y_3Fe_5O_{12}$ are randomly replaced with Ga atoms in structures where a higher Ga composition ratio means less Fe atoms having a magnetic moment.

Typical examples of antiferromagnetic dielectric materials are nickel oxide and FeO, but the majority of dielectric materials are antiferromagnetic. In the case where the magnetic dielectric layer is made of a ferromagnetic dielectric material, it is desirable to provide an antiferromagnetic layer in order to fix the direction of magnetization of the magnetic dielectric layer.

In addition, the magnetic dielectric layer may be formed in accordance with any of a sputtering method, an MOD (metal-organic decomposition) method or a sol-gel method. In addition, the magnetic dielectric layer may be single crystal or polycrystal.

Next, spin-wave spin current—pure spin current exchange from a magnetic dielectric material to a metal electrode is described. FIGS. 2(a) to 2(e) are diagrams showing a manufacturing process for the sample used in the embodiments of the present invention. In the sample, a $Y_3Fe_4GaO_{12}$ film is the magnetic dielectric material formed in accordance with an MOD method.

As shown in FIG. 2(a), an MOD solution 12 having a $Y_3Fe_4GaO_{12}$ composition was applied to a GGG ($Gd_3Ga_5O_{12}$) single crystal substrate 11 having a main surface in the {100} plane in accordance with a spin coating method. The substrate was rotated at 500 rpm for 5 seconds and after that at 3000 to 4000 rpm for 30 seconds so that the MOD solution 12 was applied uniformly so as to have a film thickness of 100 nm after sintering. Here, an MOD solution made by Kojundo Chemical Laboratory Co., Ltd. was used as the MOD solution 12.

Next, as shown in FIG. 2(b), the substrate was dried for 5 minutes on top of a hot plate heated to 150° C., so that excessive organic solvent in the MOD solution 12 was vaporized.

Next, as shown in FIG. 2(c), the substrate was pre-sintered at 550° C. for 5 minutes in an electrical furnace so as to provide an oxide layer 13.

Next, as shown in FIG. 2(d), the substrate was sintered at 750° C. for 1 to 2 hours in an electrical furnace so that the oxide layer 13 further crystallized and became a YIG layer 14. Here, the composition of the YIG layer 14 was $Y_3Fe_4GaO_{12}$ and the layer was a polycrystalline film.

Next, as shown in FIG. 2(e), a Pt film 15 having a thickness of 10 nm was provided on the YIG layer 14 in accordance with a sputtering method. Finally, the substrate was cut into pieces of 1.0 mm×3.0 mm, and thus the sample preparation was completed.

Next, the properties of the YIG film 14 were verified, by measuring the Faraday effects and the ferromagnetic resonance (FMR). As a result, as shown in FIG. 3(a), the Faraday effects were confirmed to be those of a ferromagnetic material and, as shown in FIG. 3(b), ferromagnetic resonance was also confirmed. Accordingly, the YIG layer 14 formed through the above described manufacturing process was excellent as a ferromagnetic material and had excellent crystallinity.

Next, the spin-wave spin current—pure spin current exchange in the YIG/Pt junction was verified in this sample. Concretely, the sample was measured for the presence of inverse spin-Hall effects, and it was found that the spin-wave spin current in YIG was exchanged with pure spin fcurrent in Pt. FIG. 4(a) is a schematic diagram showing the structure of the sample. The sample was irradiated with microwaves from the Pt film 15 side while an in-plane magnetic field H was generated within and the difference in potential V between the ends of the sample in a direction perpendicular to the magnetic field H was detected using a voltmeter 16.

FIG. 4(b) is a graph showing the ferromagnetic resonance properties. The YIG layer 14 used in the sample had excellent crystallinity, as described above. In addition, FIG. 4(c) shows the dependence of the output voltage V on the applied magnetic field H. The output voltage was in the microvolts for this particular intensity of the resonant magnetic field.

FIGS. 5(a) to 5(c) are a diagram and graphs showing the results of the verification of the inverse spin-Hall effects (ISHE) in a reference sample having only a YIG film. As shown in FIG. 5(a), the sample is irradiated with microwaves from the Pt film 15 side while an in-plane magnetic field H is generated within, and the difference in potential V between the ends of the sample in a direction perpendicular to the magnetic field H was detected using a voltmeter 16.

FIG. 5(b) is a graph showing the ferromagnetic resonance properties. It also shows that the YIG layer 14 in the sample had excellent crystallinity. In addition, FIG. 5(c) shows the dependence of the output voltage V on the applied magnetic field H. No significant output voltage was detected. Here, the output voltage was measured in accordance with a lock-in method, as it was assumed to be small. Thus, the longitudinal axis indicates the value gained by differentiating the output voltage V and the applied magnetic field H.

It was then verified whether a signal was, in effect, obtained in the YIG/Pt junction due to the electromotive force brought about by the inverse spin-Hall effects when a pure spin current was generated in the Pt. In order to do so, the dependence of the inverse spin-Hall effects on the in-plane/out-of-plane angles and the materials was verified. FIGS. 6(a) to 6(c) are a diagram and graphs showing the dependence of the inverse spin-Hall effects on the in-plane angle. FIG. 6(a) is a diagram showing the structure of the sample. The magnetic field H was applied at an angle θ relative to the normal in the direction in which the voltage was measured. FIG. 6(b) is a graph showing the dependence of the output voltage V on the in-plane angle θ. The cosine curve is that which can be expected from the relationship between the direction of the electric current, the direction of spin current and the spin direction. FIG. 6(c) is another graph showing the dependence of the output voltage V on the in-plane angle. The output voltage changes together with the in-plane angle of the magnetic field H. Here, the dependence on the magnetic field with $H_R$ as the origin is shown as YIG's ferromagnetic resonance in the magnetic field, and the properties are the same as in FIG. 4(c).

FIGS. 7(a) to 7(c) are a diagram and graphs showing the dependence of the inverse spin-Hall effects on the out-of-plane angle. FIG. 7(a) is a diagram showing the structure of the sample. The applied magnetic field H was being applied at an angle φ relative to the main plane when the voltage was measured. FIG. 7(b) is a graph showing the dependence of the output voltage V on the out-of-plane angle φ. The cosine curve is that which can be expected from the relationship between the direction of the electric current, the direction of spin current and the spin direction. FIG. 7(c) is another graph showing the dependence of the output voltage V on the out-of-plane angle. The output voltage changes together with the out-of-plane angle of the magnetic field H.

The present inventors were the first to prove that spin-wave spin current—pure spin current exchange occurs at the YIG/Pt interface.

FIGS. 8(a) and 8(b) are a diagram and a graph showing the dependence of the inverse spin-Hall effects on the materials. FIG. 8(a) is a diagram showing the structure of a sample.

Here, three different samples were prepared: one where the output electrode 17 was a Pt film having a thickness of 10 nm, one where it was a Cu film having a thickness of 10 nm, and one where it was a SiO$_2$ film having a thickness of 30 nm layered on top of a Pt film having a thickness of 10 nm.

FIG. 8(b) is a diagram showing the dependence of the output voltage V—microwave power properties on the materials. When the above described Pt film was used as the output electrode 17, the output voltage was more or less proportional to the microwave power. Meanwhile, for the Cu film and SiO$_2$/Pt layered film, almost no output voltage was detected.

This is because Pt is an element having strong spin-orbit coupling, and therefore the pure spin current injected from the YIG into the Pt has strong inverse spin-Hall effects. In the case of Cu, the spin-orbit coupling is very weak, and therefore the inverse spin-Hall effects are small, even when the spin-wave spin current in the YIG is exchanged with the pure spin current in the Cu, and almost no electric current is generated. In addition, in the case of the SiO$_2$/Pt layered film, there is no spin-wave spin current exchange at the interface between the YIG and SiO$_2$, and therefore there is no pure spin current through the Pt, meaning that there are no inverse spin-Hall effects. Here, no electromotive force was generated, and therefore it is clear that above electromotive force where there was pure spin current in Pt and generated as a result of inverse spin-Hall effects, is not a different electrical signal.

Figure 9:
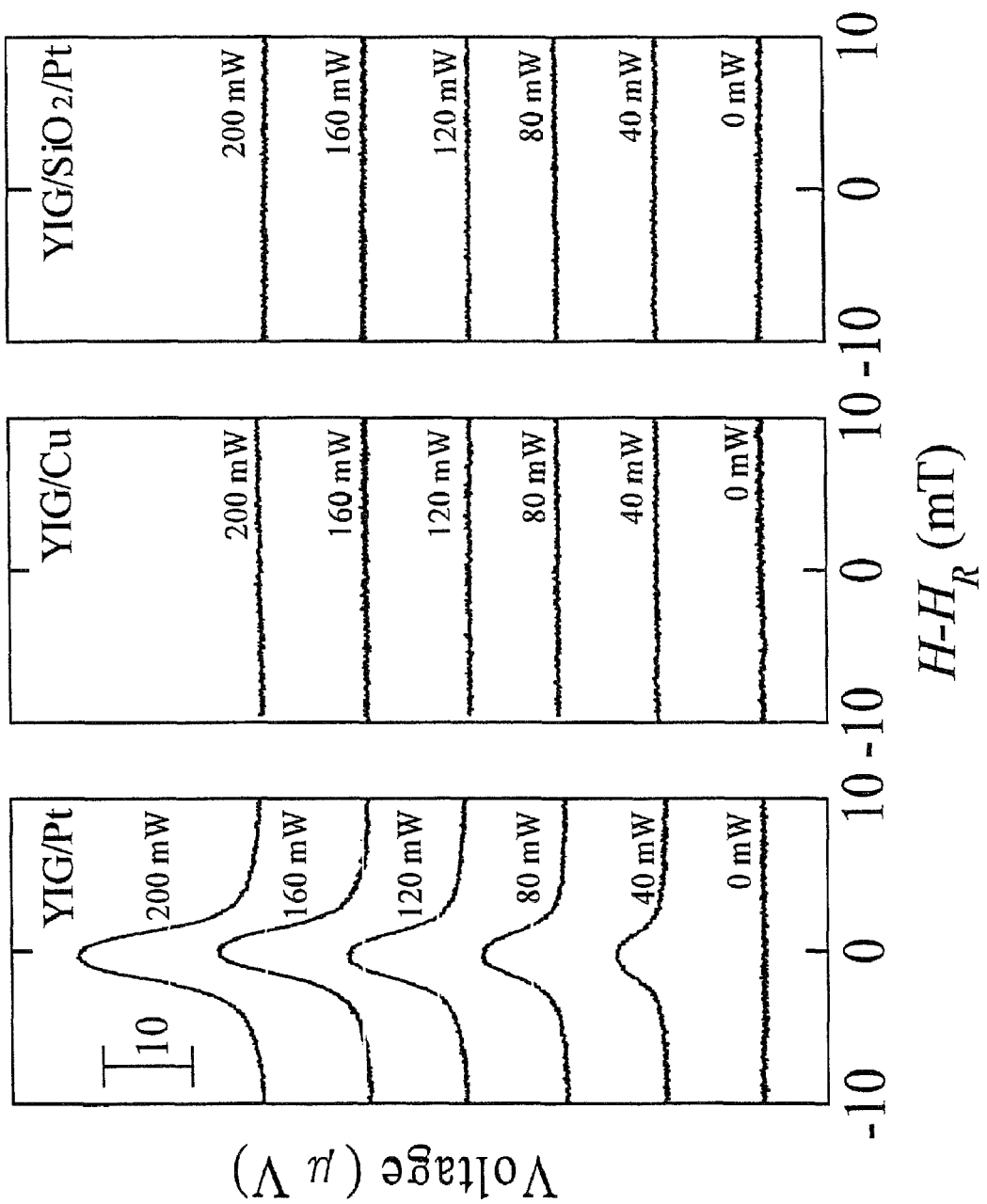
FIG. 9 is a graph showing the dependence of output voltage V on microwave power for different materials on the results in FIGS. 8(a) and 8(b)
Figure 10:
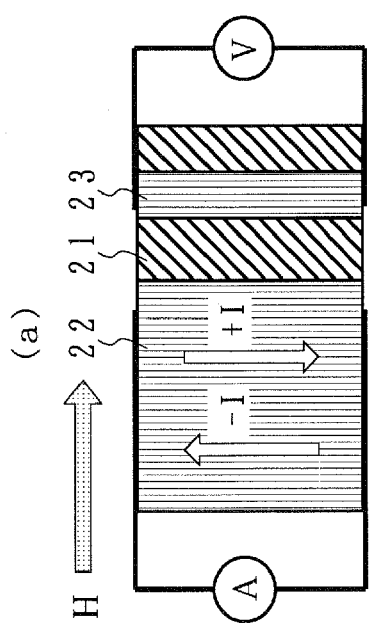
FIGS. 10(a) and 10(b) are diagrams and graphs showing the results of verification of spin transfer from a metal to the magnetic dielectric material using spin-Hall effects.
Figure 10:
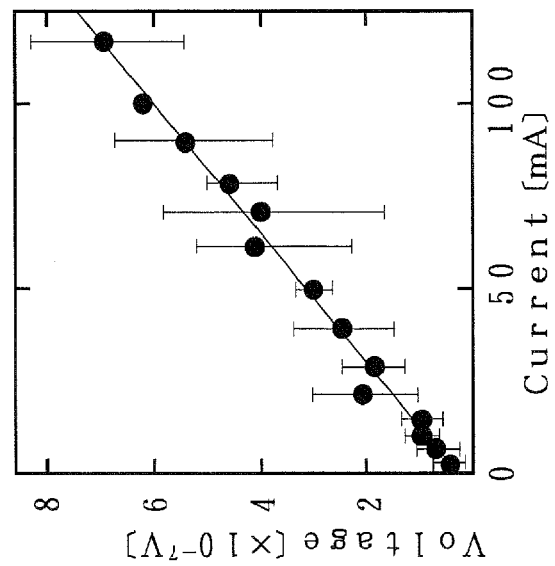
Figure 10:
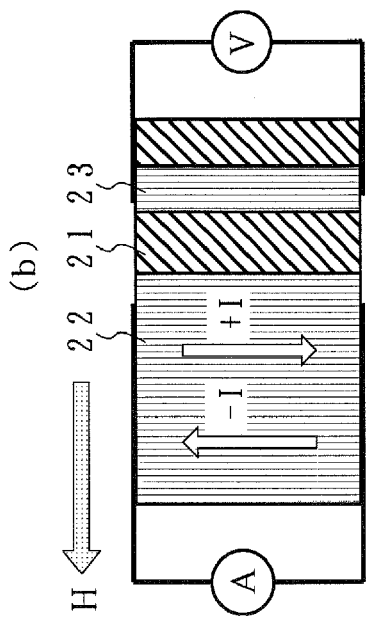
Figure 10:
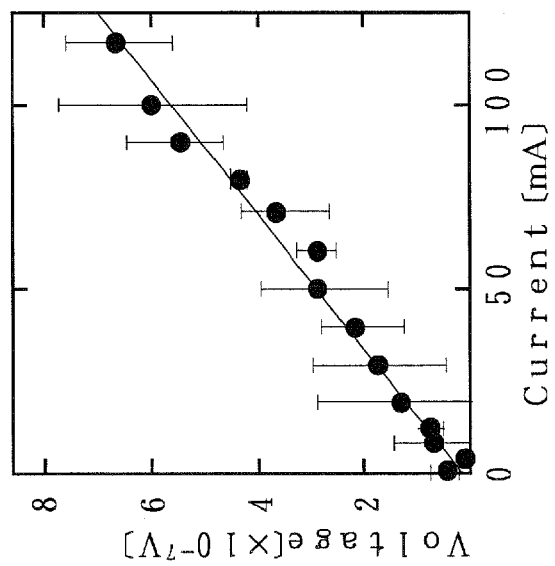

FIG. 9 is a graph based on the results of FIG. 8(b) showing the dependence of the output voltage V on the microwave power for each material. As in FIG. 8(b), an output voltage was detected only when a Pt film was used as the output electrode 17. It is clear from this that it is necessary to use an element having strong spin-orbit coupling, meaning larger inverse spin-Hall effects, for the output electrode. In addition to Pt, Pd, Au, Ag, Bi, alloys of these, and elements having an f-orbital can be used as the element having strong spin-orbit coupling.

Next, spin transfer from a metal to a magnetic dielectric material using spin-Hall effects is verified. FIGS. 10(a) and 10(b) are diagrams and graphs showing the sample and the results of measurement for spin transfer from the metal using spin-Hall effects to a magnetic dielectric material. The direction of the biased magnetic field H is reversed between FIGS. 10(a) and 10(b).

As shown in the figures, a pair of Pt electrodes 22 and 23 having a thickness of 15 nm and a width of 0.60 mm that were spaced 1.0 mm apart were provided on top of a YIG layer having a thickness of 1 µm, a length of 8.0 mm and a width of 3.0 mm. In the figures, the left side Pt electrode 22, which works as an injection electrode is emphasized.

When there are actual spin-Hall effects in the sample, pure spin current is generated in the Pt electrode 22 in a direction perpendicular to the direction of the electric current (lateral direction in the figure), due to the spin-Hall effects when there is an electric current I running through the Pt electrode 22 in the direction of the width of the YIG film 21 (longitudinal direction in the figure). The generated pure spin current causes spin-wave spin current in the YIG layer 21 as a result of the exchange from pure spin current to spin-wave spin current at the Pt/YIG interface.

The spin-wave spin current is transferred through the YIG layer 21 and generates pure spin current in the Pt electrode 23 at the interface between the YIG layer 21 and the Pt electrode 23. There is an electric current in a direction perpendicular to the pure spin current (longitudinal direction in the figure) due to the inverse spin-Hall effects, so that there is a difference in potential V between the two ends of the Pt electrode 23.

The output voltage V was more or less proportional to the value of the electric current I flowing through the Pt electrode 22, and thus it is confirmed that the spin current generated as a result of the spin-Hall effects was converted to spin-wave spin current, and that the spin was transferred from the Pt electrode 22 to the YIG layer 21. In addition, it is clear from the obtained V-I characteristics that there was no dependence on the direction of the fixed magnetic field.

Figure 11:
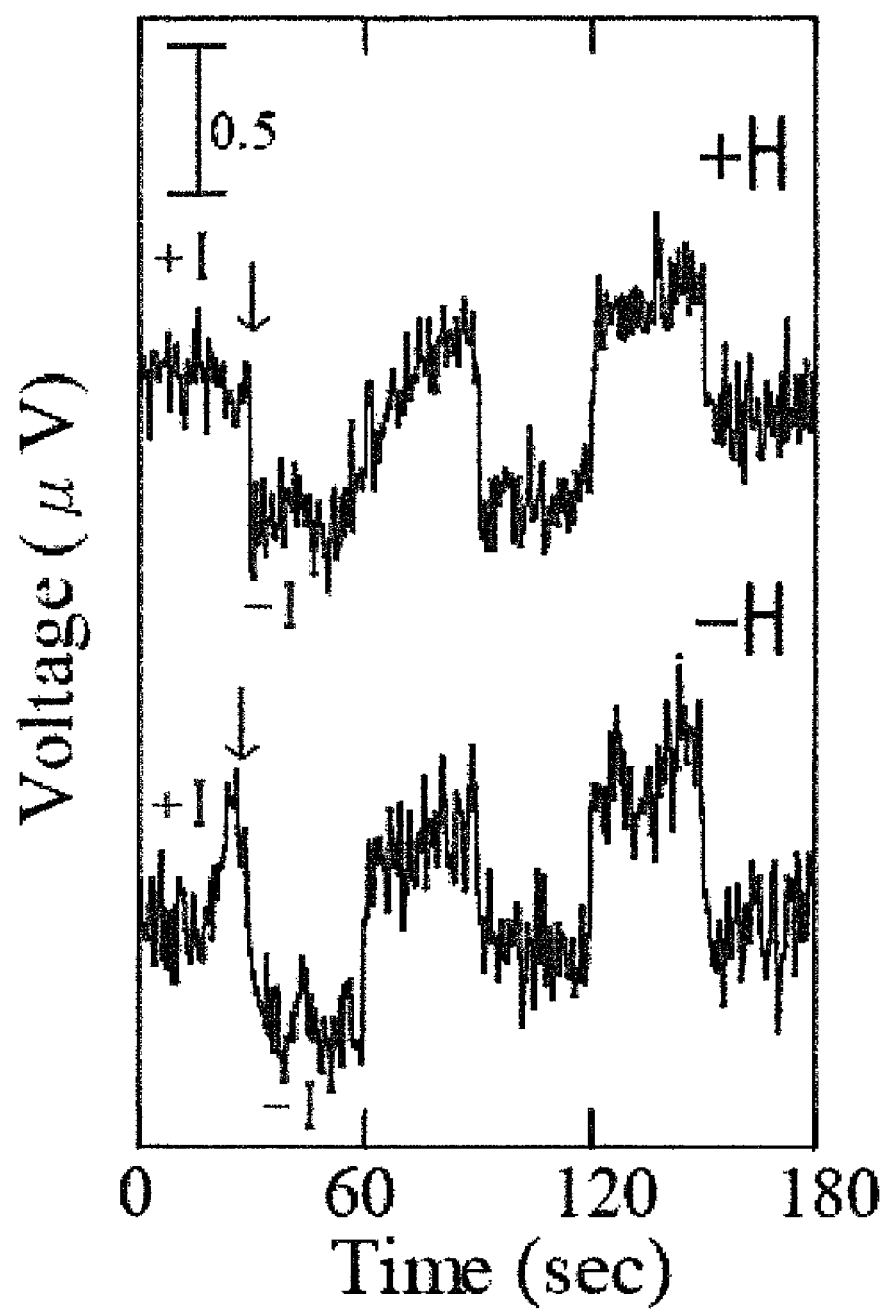
FIG. 11 is a graph showing the dependence of the output voltage V on the polarity of the electric current.

FIG. 11 is a diagram showing the dependence of the output voltage V on the polarity of the electric current. It was confirmed that the output voltage V is dependent on the direction of the electric current, whether or not when the direction of the applied magnetic field is +H or when it is −H. This means that the output voltage V detected in the Pt electrode 23 was not due to the spin-wave spin current generated by the heat; that is, the difference in temperature between the two ends of the YIG layer 21 in the longitudinal direction. Accordingly, it is clear from the results of measurement in FIG. 10 that the spin was transferred from the Pt electrode 22 to the YIG layer 21 due to the spin-Hall effects.

Thus, the present inventors discovered that spin is transferred at the interface between the metal and the magnetic dielectric material when a magnetic dielectric material such as YIG is used and Pt having strong spin-orbit coupling is used as the metal for forming a junction. Using this knowledge, information transmission and energy transmission over long distances become possible using spin-wave spin current where the loss in the spin angular momentum is very small in comparison with cases where pure spin current using conduction electrons as a medium is used.

FIRST EMBODIMENT

Figure 12:
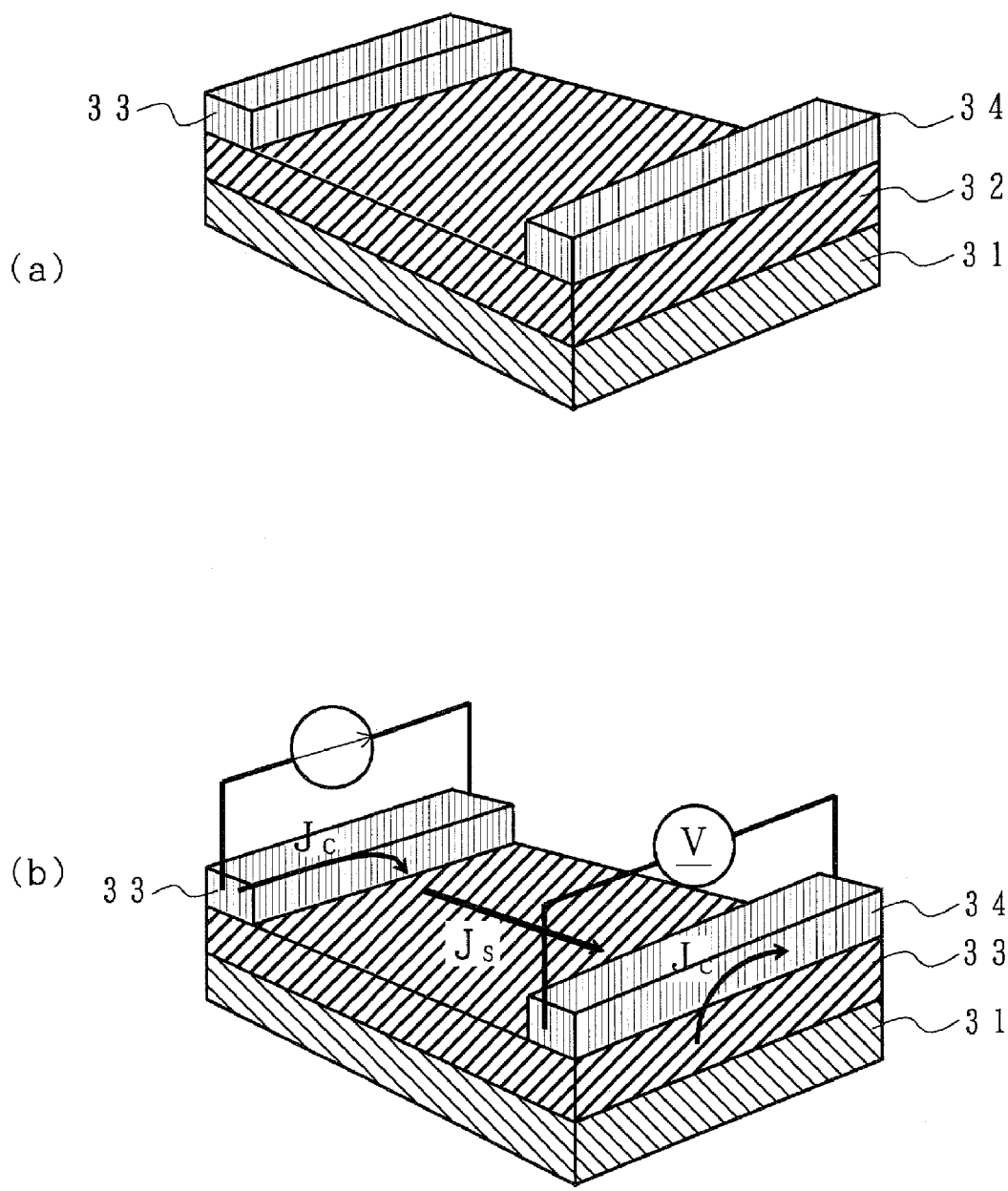
FIGS. 12(a) and 12(b) are diagrams showing the spintronic device according to the first embodiment of the present invention.

Next, the spintronic device according to the first embodiment of the present invention is described in reference to FIGS. 12(a) and 12(b). FIG. 12a is a conceptual diagram showing the structure of the spintronic device according to the first embodiment of the present invention, where a YIG layer 32 having a thickness of 50 nm and a Y$_3$Fe$_4$GaO$_{12}$ composition is formed on a GGG single crystal substrate 31 in accordance with a sputtering method, and a Pt film having a thickness of 10 nm was deposited on top in accordance with a mask sputtering method, so that Pt electrodes 33 and 34 having a width of 1.0 mm were formed with a space of 5.0 mm in between.

FIG. 12(b) is a diagram illustrating an information transmitting method using a spintronic device where a pulse signal is applied to the Pt electrode 33 so that a pulse current flows through the Pt electrode and a pure pulse spin current is generated in a direction perpendicular to the direction of the pulse current due to the spin-Hall effects. The pure pulse spin current causes spin-wave spin current having a phase that changes in response to change in the pure pulse spin current in the YIG layer 32 at the interface between the Pt electrode 33 and the YIG layer 32.

This spin-wave spin current is transported through the YIG film 32 and reaches the Pt electrode 34, so that a pure pulse spin current is generated in accordance with the change in the phase of the spin-wave spin current within the Pt electrode 34 at the interface between the YIG layer 32 and the Pt electrode 34. This pure pulse spin current causes a pulse current in a direction perpendicular to the pure pulse spin current within the Pt electrode 34 due to the inverse spin-Hall effects, and this pulse current is detected as a pulse voltage between the two ends of the Pt electrode 34.

In this case, the spin transfer in the YIG film 32 results from the pulse wave spin current and conduction electrons are not involved, and therefore there is no dissipation of the spin angular momentum due to the friction of the spin, and thus information transmission becomes possible over a distance of several millimeters or more, even in the meters.

In particular, the spin is transferred due to the spin-wave spin current with high efficiency in high frequency bands in the gigahertz, because the spin cannot easily respond in a direct current or in low-frequency bands, and therefore information transmission is effective in high frequency bands in the gigahertz.

SECOND EMBODIMENT

Figure 13:
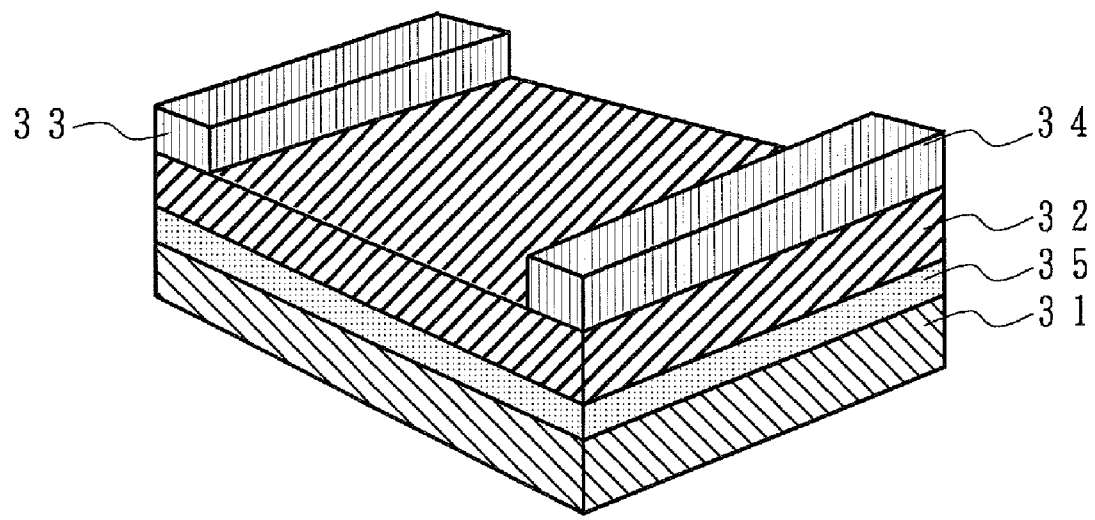
FIG. 13 is a schematic diagram showing the structure of the spintronic device according to the second embodiment of the present invention.
Figure 14:
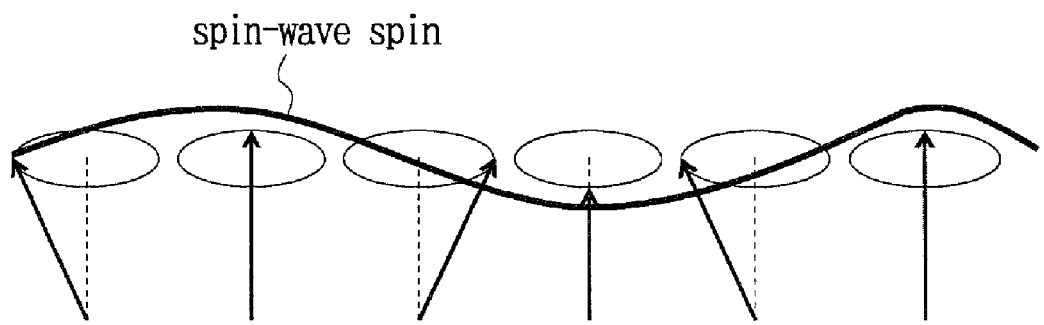
FIG. 14 is a schematic diagram showing spin-wave spin current.

Next, the spintronic device according to the second embodiment of the present invention is described in reference to FIG. 13. FIG. 13 is a conceptual diagram showing the structure of the spintronic device according to the second embodiment of the present invention, where an antiferromagnetic PdPtMn layer 35 having a thickness of 100 nm is deposited on top of a GGG single crystal substrate 31 in accordance with a sputtering method. A magnetic field is applied to the sample in the direction of the width when the antiferromagnetic PdPtMn layer 35 is deposited.

Next, a YIG layer 32 having a thickness of 50 nm and a $Y_3Fe_4GaO_{12}$ composition is formed on top of the antiferromagnetic PdPtMn layer 35 in accordance with a sputtering method, and a Pt film having a thickness of 10 nm is deposited on top in accordance with a mask sputtering method, so that Pt electrodes 33 and 34 having a width of 1.0 mm are formed with a space of 5.0 mm in between.

In this case, all of the grains in the polycrystal that forms the YIG layer 32 are magnetized in the same direction because of the antiferromagnetic PdPtMn layer, and therefore it becomes possible for the spin to be transferred without making the direction of magnetization uniform using an external magnetic field. Here, the information transmitting method and the principle behind the second embodiment are exactly the same as in the first embodiment.

Though modes and embodiments of the present invention are described in the above, the present invention is not limited to the structures and conditions therein, and various modifications are possible. For example, information is transmitted through spin transfer in the above embodiments, but an electric current may be transported; that is to say, energy may be transported through spin transfer.

As described above, the spin current is in a direction perpendicular to the current, and therefore the amount of spin current can be increased by increasing the width of the magnetic dielectric material and thus upon scaling, the electric current is transferred without increase of loss by increase of resistance due to Ohm's law.

In addition, a three-dimensional circuit network may be formed by incorporating the spintronic device according to the above embodiments in a semiconductor integrated circuit. In this case, an antiferromagnetic dielectric material is used as the magnetic dielectric material for spin transfer medium, so that the operation of the semiconductor device will not be magnetically affected by the magnetic dielectric materials.

INDUSTRIAL APPLICABILITY

A typical example of applications for the present invention is information transmission, but the present invention can also be applied to electric current transportation and energy transportation.

The invention claimed is:

1. A spintronic device, comprising: a magnetic dielectric layer; and at least one metal electrode made of any of Pt, Au, Pd, Ag, Bi, alloys of these, or elements having an f-orbital, wherein spin-wave spin current—pure spin current exchange is carried out at the interface between said magnetic dielectric layer and said metal electrode.

2. The spintronic device according to claim 1, wherein at least two of said metal electrode are provided so that one metal electrode serves as a spin current injection electrode through which a spin-wave spin current is injected into said magnetic dielectric layer and another metal electrode serves as an output electrode for converting the spin-wave spin current from said magnetic dielectric layer as an electric current.

3. The spintronic device according to claim 1, wherein said magnetic dielectric layer is made of any of a ferrimagnetic dielectric material, a ferromagnetic dielectric material or an antiferromagnetic dielectric material.

4. The spintronic device according to claim 1, wherein said magnetic dielectric layer is made either of a ferrimagnetic dielectric material or a ferromagnetic dielectric material, and said magnetic dielectric layer is provided on top of an antiferromagnetic layer for fixing the direction of magnetization of the magnetic dielectric layer.

5. The spintronic device according to claim 1, wherein said magnetic dielectric layer is made of $Y_3Fe_{5-x}Ga_xO_{12}$ (here, x<5).

6. An information transmitting method comprising the steps of: providing at least a pair of metal electrodes made of any of Pt, Au, Pd, Ag, Bi, alloys of these, or elements having an f-orbital on top of a magnetic dielectric layer; making a signal current flow through one of said pair of metal electrodes so that a spin-wave spin current corresponding to the signal current is injected into said magnetic dielectric layer; making the spin-wave spin current transmitted through said magnetic dielectric layer generate a pure spin current in the other of said pair of metal electrodes; and converting into a signal current in a direction perpendicular to said pure spin current.

* * * * *